United States Patent [19]

Abadeer et al.

[11] Patent Number: 5,334,880
[45] Date of Patent: Aug. 2, 1994

[54] LOW VOLTAGE PROGRAMMABLE STORAGE ELEMENT

[75] Inventors: Wagdi W. Abadeer, Jericho; Badih El-Kareh, Milton; Wayne F. Ellis, Jericho; Duane E. Galbi, Essex Jct.; Nathan R. Hiltebeitel, Essex Jct.; William R. Tonti, Essex Jct.; Josef S. Watts, South Burlington, all of Vt.

[73] Assignee: International Business Machines Corporation, Armonk, N.Y.

[21] Appl. No.: 693,463

[22] Filed: Apr. 30, 1991

[51] Int. Cl.$^5$ .............. G11C 11/34; G11C 11/40; G11C 7/00; H01L 29/04
[52] U.S. Cl. .............. 307/219; 257/50; 307/465; 365/148; 365/154; 365/205; 365/225.7
[58] Field of Search ............ 365/148, 154, 205, 225.7, 365/182; 307/202.1, 465, 219; 257/529, 530, 50

[56] References Cited

U.S. PATENT DOCUMENTS

| | | | |
|---|---|---|---|
| 4,042,950 | 8/1977 | Price | 357/51 |
| 4,135,295 | 1/1979 | Price | 357/51 |
| 4,146,902 | 3/1979 | Tanimoto et al. | 357/6 |
| 4,210,996 | 7/1980 | Amemiya et al. | 29/610 R |
| 4,229,502 | 10/1980 | Wu et al. | 428/446 |
| 4,309,224 | 1/1982 | Shibata | 148/1.5 |
| 4,399,372 | 8/1983 | Tanimoto et al. | 307/279 |
| 4,446,534 | 5/1984 | Smith | 365/96 |
| 4,455,495 | 6/1984 | Masuhara et al. | 307/44 |
| 4,546,454 | 10/1985 | Gupta et al. | 365/200 |
| 4,571,707 | 2/1986 | Watanabe | 365/200 |
| 4,590,589 | 5/1986 | Gerzberg | 257/529 |
| 4,609,830 | 9/1986 | Brandman | 307/451 |
| 4,670,970 | 6/1987 | Bajor | 29/584 |
| 4,698,589 | 10/1987 | Blankenship et al. | 365/201 |
| 4,707,806 | 11/1987 | Takemae et al. | 365/96 |
| 4,821,091 | 4/1989 | Hammond et al. | 357/30 |
| 4,837,520 | 6/1989 | Golke et al. | 324/550 |
| 4,912,066 | 3/1990 | Wills | 437/173 |
| 4,935,899 | 6/1990 | Morigami | 365/200 |

OTHER PUBLICATIONS

Kazuhiro Sawada et al., "Built-In Self-Repair Circuit For High-Density ASMIC"; IEEE Conference Of Custom Integrated Circuits, pp. 26.1.1-26.1.3 (1989).
"Programmable Address Inverting Circuit", IBM Technical Disclosure Bulletin, vol. 27, No. 11, Apr. 1985 pp. 6416, 6417.
E. Hamdy et al., "Dielectric Based Antifuse For Logic And Memory ICs.", Transactions of the International Electron Device Meeting, pp. 786-789 (San Francisco, Dec. 1988).
K. Kato et al., "A Physical Mechanism of Current Induced Resistance Decrease In Heavily Doped Polysilicon Resistors", IEEE Transactions on Electron Devices, vol. ED-29, No. 8, pp. 1156-1161, Aug. 1982.
Yosi Shacham-Diamond et al., "A Novel Ion-Implanted Amorphous Silicon Programmable Element", International Electron Device Meeting, Digest 1987, pp. 194-197 (Washington, D.C., 1987).
IEEE Journal of Solid-State Circuits, vol. 24, No. 3 (Jun. 1989), New York, pp. 839-841, Shacham-Diamond et al., "A Bridge Circuit for the Characterization of Electrically Programmable Elements".

*Primary Examiner*—Rolf Hille
*Assistant Examiner*—Peter Toby Brown
*Attorney, Agent, or Firm*—Sughrue, Mion, Zinn, Macpeak & Seas

[57] ABSTRACT

A programmable storage element for redundancy-programming includes a programmable antifuse circuit, which includes a plurality of first resistors and a switching circuit for coupling the first resistors in series in response to a plurality of first control signals and for coupling the first resistors in parallel in response to a plurality of second control signals to permit programming of the first resistors, and a sensing circuit for determining whether or not the first resistors have been programmed. The state of the first resistors is determined by comparing a first voltage drop across the first resistors with a second voltage drop across a second resistor. Each of the first resistors is an unsilicided polysilicon conductor which has an irreversible resistance decrease when a predetermined threshold current is applied for a minimum period of time.

19 Claims, 6 Drawing Sheets

LOW VOLTAGE PROGRAMMABLE STORAGE ELEMENT

FIELD OF THE INVENTION

The present invention relates generally to a programmable storage element. More specifically, the present invention relates to a programmable storage element for programming redundancy wherein a resistance decrease in a programmable antifuse circuit is sensed by a sensing circuit in the storage element.

BACKGROUND OF THE INVENTION

The capability for redundancy-programing after fabricating integrated semiconductor devices is desirable for many devices including programmable logic devices, programmable memories and linear circuits, as well as for selecting discretionary wiring in VLSI devices.

In a random access memory (RAM) device, for example, a large number of memory cells are arranged in rows and columns. The density of defects generated in the RAM during manufacturing is relatively independent of the integration density of the device, depending more on the semiconductor manufacturing technology. In general, the higher the integration density of the device, the larger the ratio of normal memory cells to defective memory cells. This larger ratio is one of the advantages of increasing the integration of a semiconductor memory device.

Even if the RAM includes only one defective memory cell, the device cannot be operated normally. To overcome this problem, RAM devices may include a plurality of redundant memory cells, e.g., redundant rows and/or columns of memory cells. Thus, when a defective memory cell is detected by testing, for example, during the final stages of the manufacturing process, it is replaced by one or more redundant memory cells. This replacement is generally accomplished by replacing a row or column of memory cells rather than by replacing an individual cell. In other words, a row containing a defective memory cell is replaced by a redundant row containing only operating memory cells.

It will be apparent that the use of redundant memory cells further requires inclusion of a control circuit so that associated encoders or decoders will properly address the selected redundant row or column of memory cells in response to an address for a row or column containing the defective memory cell. It will also be apparent that the control circuit includes one or more circuit elements for storing information, elements for selecting between groups of memory cells, and some additional device for programming the information storing elements. U.S. Pat. Nos. 4,609,830 and 4,707,806 disclose examples of this type of control circuit. IBM Technical Disclosure Bulletin Vol. 27, No. 11 (April 1985) discloses a programmable address inverting circuit wherein the condition of a fuse or programmable link provides selected switchable complementary output signals used in driving an address buffer. The logical extension of such control circuits is to provide built-in self repair circuits, such as that disclosed in Sawada et al., *"Built-in Self-Repair Circuit for High-Density AS-MIC,"* IEEE Conference of Custom Integrated Circuits, pages 26.1.1–26.1.3 (1989), for VLSI devices.

Fusible links are known for redundancy-programming a variety of semiconductor devices, including the RAM device discussed above. Fusible links are either open or closed, thus effectively storing "0" or "1" values. These links are generally programmed by either applying a predetermined voltage directly to the fusible link or by applying an external energy source such as a laser beam to the fusible link. U.S. Pat. Nos. 4,042,950 and 4,135,295 disclose fusible links closed by a predetermined voltage applied to the link, which produces a current density greater than the required fusing current, thus removing an insulating layer and closing, i.e., shorting, the fusible link. U.S. Pat. No. 4,670,970 discloses a normally open fusible link which closes by solid phase diffusion of metal into a silicon layer to produce a conductive silicon layer. U.S. Pat. No. 4,446,534 discloses a circuit including a fusible link which is programmed by applying a voltage of opposite polarity rather than a relatively high voltage of normal polarity. U.S. Pat. No. 4,455,495 discloses a fusible link of the second type wherein a non-conductive element is short circuited by application of a laser beam. Of course, devices are also known where fusible links are programmed by application of both a predetermined voltage and a laser beam, such as that disclosed in U.S. Pat. No. 4,912,066.

In recent years, redundancy-programming using an applied laser beam has become the programming method of choice. However, this programming method has several disadvantages. Programming mechanisms for this type of programming are expensive, often costing in excess of a million dollars per work station. In addition, laser redundancy-programming is relatively slow due both to the need to select the individual fusible links to be programmed as well as to the need for post-programming fabrication steps such as clean up of the area, e.g., the blast crater, around the fusible link. It will also be appreciated that continually increasing device densities will eventually produce element spacing so small that laser programming cannot be accomplished without at least partial damage to adjacent elements, which will, of course, result in reducing the mean time between failures for these high density devices. Moreover, misalignment between the laser spot and the fuse to be blown may lead to incomplete or inaccurate fuse blow, which could actually detract from the overall process yield. Other problems associated with programmable fusible links are discussed in U.S. Pat. No. 4,546,454.

Control circuitry, which includes fusible links for redundancy-programming, is disclosed in U.S. Pat. Nos. 4,571,707 and 4,609,830. In addition, circuitry for detecting the condition or state of fusible links includes the coincidence detection circuit of U.S. Pat. No. 4,707,806, as well as the circuit employing a flipflop, which includes a plurality of conventional fuses, disclosed in U.S. Pat. No. 4,837,520.

During recent years, it has been reported that current-induced resistance decreases in heavily doped polysilicon resistors is possible. See Kato et al., *"A Physical Mechanism of Current-Induced Resistance Decrease in Heavily Doped Polysilicon Resistors,"* IEEE Transactions on Electron Devices, Vol. ED28, No. 8, pages 1154–61 (August 1982). Resistance decreases of up to 50 percent, which are controllable within an accuracy of 0.01 percent, were reported. Another antifuse concept is described by Hamdy et al., *"Dielectric Based Antifuse for Logic and Memory ICs,"* Transactions of the International Electron Device Meeting, pages 786–789 (San Francisco, December 1988), which discloses the use and programming of a polysilicon insulator-diffusion sandwich which is programmed by rupturing the insulator between the two conducting layers at high voltage (18V). An additional programmable scheme is described by Y. Shacham-Diamand et al. in "A Novel Ion-Implanted Amorphous Silicon Programmable Element," International Electron Device Meeting, Digest 1987, pages 194–197 (Washington, D.C., 1987). The method consists of creating a highly resistive amorphous layer by heavy dose ion-implantation and switching the layer to low impedance by applying a programming voltage to the layer.

The use of polycrystaline silicon in semiconductor devices is known for fabricating electrically tunable resistors, such as disclosed in U.S. Pat. No. 4,210,996, as well as other structures including photoconductor sites, as disclosed in U.S. Pat. No. 4,821,091. The fact that the resistance of a polycrystaline silicon resistor varies linearly according to the magnitude of an applied voltage, once a threshold voltage has been applied, has also been used in switching circuitry, such as the read only memory (ROM) device disclosed in U.S. Pat. No. 4,146,902, and control signal generating circuitry disclosed in U.S. Pat. No. 4,399,372. Methods for manufacturing semiconductor devices from polycrystaline silicon are disclosed in U.S. Pat. Nos. 4,229,502 and 4,309,224. However, the programming of antifuse polysilicon devices generally requires application of tens of volts in order to produce the required current density necessary to induce resistance changes in the polysilicon. Given the high densities and short channel lengths of current integrated circuitry, application of such high voltage/current stresses should be avoided if possible.

SUMMARY OF THE INVENTION

The principal object of the present invention is to provide a programmable antifuse circuit having a resistance which is programmable at a low current value.

Another object of the present invention is to provide a programmable storage element which can be programmed during a short time period.

Still another object of the present invention is to provide a programmable storage element having circuitry for determining the programming state of the programmable storage element.

Another object of the present invention is to provide a programmable storage element which is field programmable.

Yet another object of the present invention is to provide a programmable storage device which can be programmed at a low cost. Preferably, the programmable storage element can be programmed using conventional bench testing equipment, thus avoiding the need for more capital intensive programming equipment.

These and other objects, features and advantages of the present invention are provided by a programmable storage element, comprising a plurality of first resistors, a switching circuit for operatively coupling the first resistors in series in response to a plurality of first control signals and for operatively coupling the first resistors in parallel in response to a plurality of second control signals so as to permit programming of the first resistors, and a sensing circuit for sensing whether or not the first resistors have been programmed. According to one aspect of the present invention, the programmable storage element further comprises a plurality of second resistors, and a second switching circuit for coupling the second resistors in series in response to a plurality of third control signals and for coupling the second resistors in parallel in response to a plurality of fourth control signals so as to permit programming of the second resistors, wherein the sensing circuit senses whether or not at least one of the first and the second resistors has been programmed.

Each of the plurality of resistors operatively coupled by the corresponding switching circuit comprises a programmable antifuse circuit according to the present invention. Each of the plurality of resistors has a predetermined series resistance which advantageously can be reduced to a second series resistance by the application of a predetermined threshold current. The switching circuits advantageously couple the resistors in series in response to a plurality of first control signals for determining the program state of the resistors, and couple the resistors in parallel in response to a plurality of second control signals to permit application of the predetermined threshold current to the resistors for programming the resistors.

According to the present invention a semiconductor device, having a programmable storage element for programming redundancy, comprises a plurality of first resistors; a plurality of second resistors; a plurality of first transistors for coupling the first resistors in series in response to a plurality of first control signals and for coupling the resistors in parallel in response to a plurality of second control signals to permit programming of the first resistors; a plurality of second transistors for coupling the second resistors in series in response to a plurality of third control signals and for coupling the second resistors in parallel in response to a plurality of fourth control signals to permit programming of the second resistors; and a plurality of third transistors operatively coupled to produce a latch for comparing a first voltage drop across the first resistors with a second voltage drop across the second resistors to determine whether or not at least one of the first resistors and the second resistors has been programmed. According to an aspect of the present invention, the first and second resistors are programmed by the application of a programming current having a magnitude greater than or equal to a predetermined threshold current and having a pulse width greater than a predetermined time period.

These and other objects, features and advantages of the invention are disclosed in or apparent from the following description of preferred embodiments.

BRIEF DESCRIPTION OF THE DRAWING

Preferred embodiments are described with reference to the drawing in which like elements are denoted throughout by like or similar numbers, and in which.

DESCRIPTION OF THE PREFERRED EMBODIMENTS

Figure 1A:
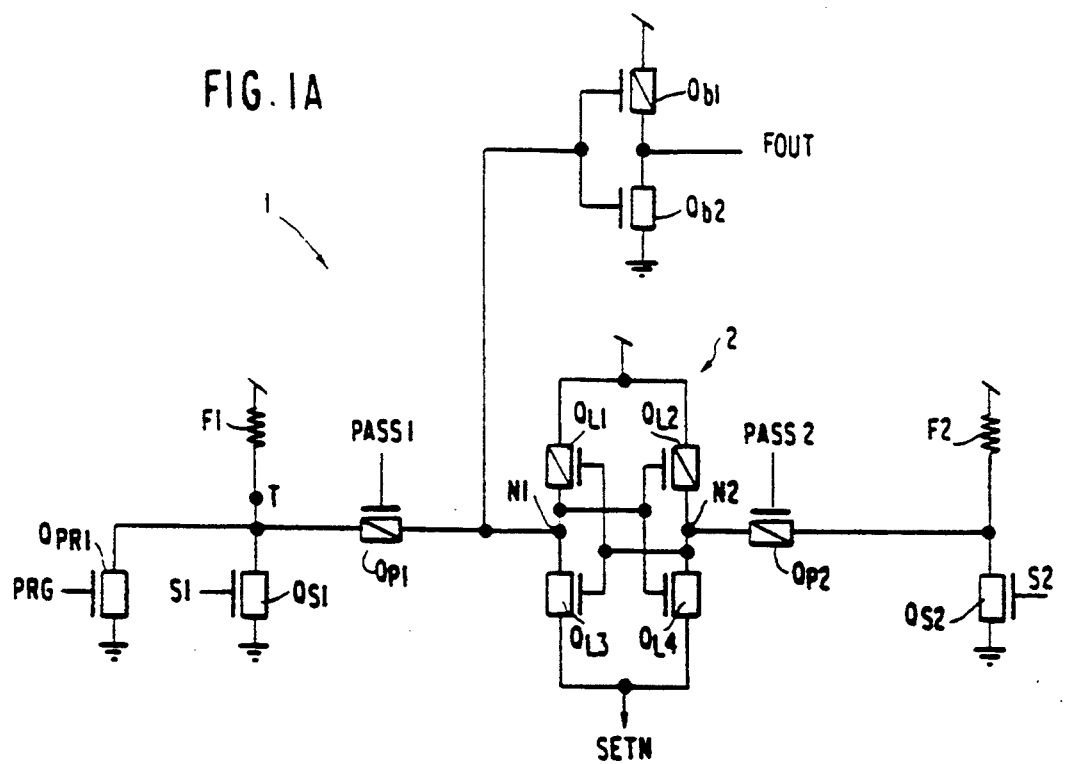
FIG. 1A is a schematic diagram of a preferred embodiment of a programmable storage element according to the present invention.

A preferred embodiment of a programmable storage element 1 according to the present invention is shown in FIG. 1A and comprises a plurality of transistors $Q_{L1}$ through $Q_{L4}$ operatively connected to form a sensing latch 2 having nodes N1 and N2, and antifuse elements F1 and F2 operatively coupled to nodes N1 and N2, respectively, via corresponding ones of transistors $Q_{P1}$ and $Q_{P2}$. Preferably, antifuse F1 is a programmable antifuse circuit, discussed in greater detail below, which advantageously is connected to a transistor $Q_{PR1}$ used in programming antifuse F1. However, antifuse F1 can also be a single polysilicon element having the characteristics discussed below.

Antifuses F1 and F2 are connected to respective drains of transistors $Q_{S1}$ and $Q_{S2}$, which draw equal amounts of current through antifuses F1 and F2 to convert resistance difference between antifuses F1 and F2 into a voltage difference across the antifuses F1 and F2. Sensing latch 2 advantageously amplifies the voltage difference across antifuses F1 and F2. Preferably, the final state of sensing latch 2 is indicative of the antifuse F1, F2 having the higher resistance. One of the nodes N1 and N2 is connected to an output terminal $F_{out}$ via an inverter formed from a pair of transistors $Q_{b1}$ and $Q_{b2}$, which buffer the sensing latch 2 output. For the programmable storage element 1 shown in FIG. 1A, a signal at $F_{out}$ is equal to voltage $V_{dd}$ when the resistance of F1 is greater than the resistance of F2, while the signal at $F_{out}$ is equal to ground potential GND when the resistance values of F1 and F2 are reversed.

Figure 1B:
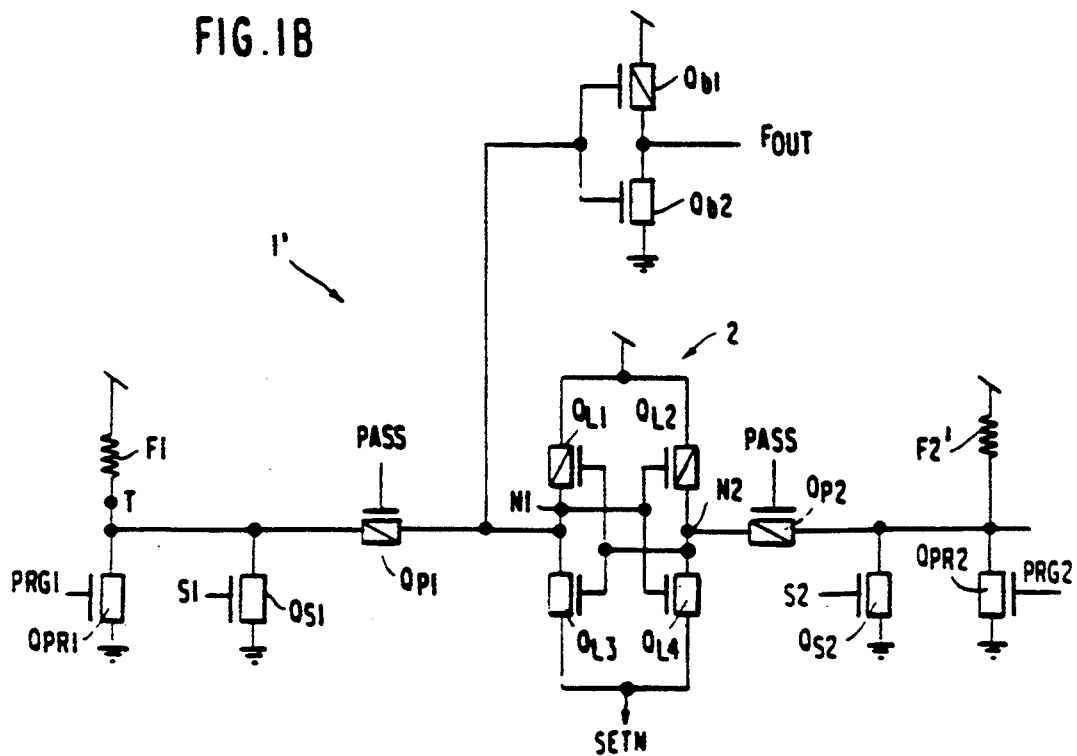
FIG. 1B. is a modification of the programmable storage element shown in FIG. 1A.

A modified programmable storage element 1' is shown in FIG. 1B, which is different from the circuit shown in FIG. 1A in two respects. First, antifuse F2 of FIG. 1A is replaced by programmable antifuse circuit F2', which advantageously is coupled to a transistor $Q_{PR2}$ for programming. Second, the initial resistance values of antifuses F1 and F2' are equal to one another in the programmable storage element 1'.

In FIG. 1A, the resistances of antifuses F1 and F2 are initially mismatched by about 10%, with F1 advantageously having the largest initial resistance. For reasons discussed below, 10% is about half the minimum resistance change in antifuse F1 after programming. This initial mismatch between the resistance of antifuses F1 and F2 provides an initial ordering of the antifuse resistances, which advantageously can be detected by sensing latch 2. However, the initial resistance values of antifuses F1 and F2' in FIG. 1B are equal. It will be apparent that one of the antifuses F1 and F2' must be programmed to provide an ordering of the antifuse resistances. It will also be noted that, since the resistances of antifuses F1 and F2' were initially equal, the margin between the two resistance values after programming will be larger in the circuit of FIG. 1B than in the circuit of FIG. 1A. Therefore, the programmable storage element 1' is less sensitive to process variation than programmable storage element 1.

It should be noted that both configurations of the programmable storage elements 1, 1' shown in FIGS. 1A and 1B can advantageously be used in a variety of semiconductor devices. Preferably, programmable storage element 1 is used in semiconductor devices requiring an initial state indication while programmable storage element 1' is used in semiconductor devices requiring a higher operating margin.

Figure 2:
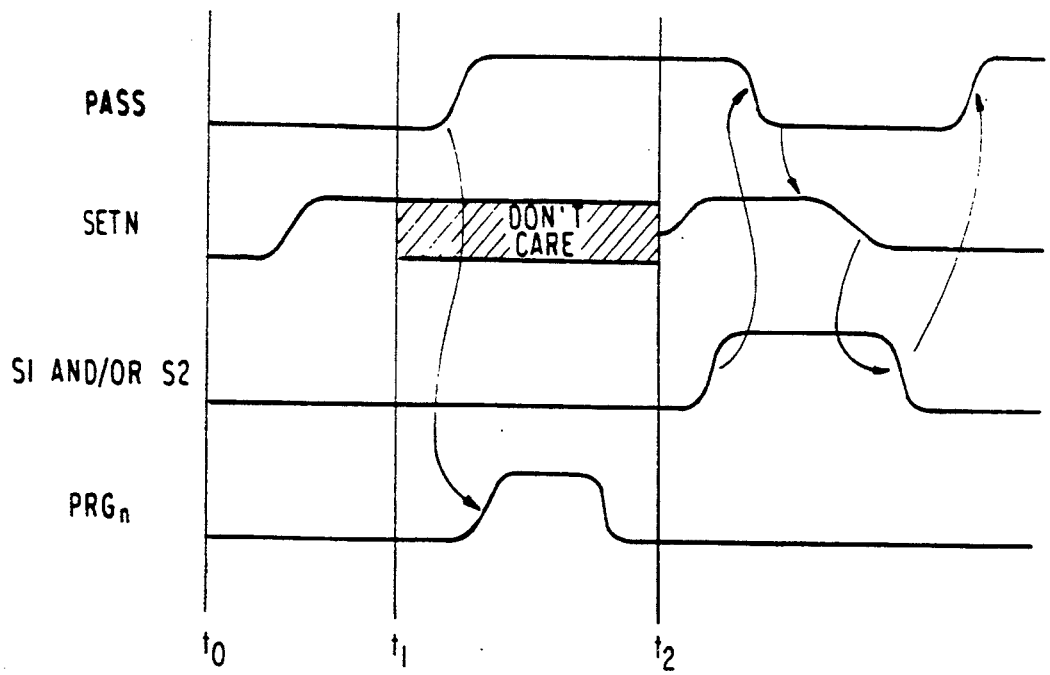
FIG. 2 illustrates a plurality of wave forms produced during a plurality of operational modes of the circuits shown in FIGS. 1A and 1B.

The four operational modes of the circuits shown in FIGS. 1A and 1B are described while referring to the wave forms depicted in FIG. 2. During the Chip Power Up mode, which starts at time $t_0$, the value of SETN ramps up with voltage $V_{dd}$ while all other mode values remain low.

During the Redundancy Invoke mode, shown starting at time $t_1$, SETN remains high while pass goes high. It will be apparent that the value of SETN is a "don't care" value, since the signal Pass causes a selected one of transistors $Q_{P1}$ and $Q_{P2}$ to isolate the element F1 and F2 (F2') selected for programming from sensing latch 2. A programming signal PRGn, where n is equal to 1 or 2, selected by redundant address decode circuitry (not shown), goes high and is applied to the corresponding one of transistors $Q_{PR1}$ and $Q_{PR2}$, causing the selected one of these transistors to pull at least a predetermined threshold current through the selected antifuse F1 and F2 (F2'). Preferably, the pulse width of the predetermined threshold current is sufficiently wide to cause a resistance change in the selected one of antifuses F1 and F2 (F2').

During the State Initialization mode of operation, shown starting at time $t_2$, SETN goes high, after which transistors $Q_{P1}$, $Q_{P2}$, $Q_{S1}$ and $Q_{S2}$ are turned on by control signals Pass1, Pass2, S1 and S2, respectively. After transistors $Q_{S1}$ and $Q_{S2}$ create respective voltage drops across antifuses F1 and F2 (F2'), SETN is slowly pulled to GND by a conventional slow set device (not shown). SETN is then pulled to GND by a conventional fast set device (not shown), which advantageously is larger than the slow set device. SETN going to GND advantageously causes signals Pass1 and Pass2 to go high, thus isolating sensing latch 2 from antifuses F1 and F2 (F2'). The inverted output of sensing latch 2 at terminal $F_{out}$ advantageously can now be sensed by any additional circuitry which is connected to sample the state of sensing latch 2.

The State Soft Set operational mode, which advantageously allows testing of the antifuses F1 and F2 (F2'), circuitry associated with the antifuses, and their corresponding memory elements by setting the sensing latch 2 in a predetermined state, also begins at time $t_2$. The State Soft Set mode is similar to the Redundant State Initialization mode, described immediately above, except that in the State Soft Set mode only one of transistors $Q_{S1}$ and $Q_{S2}$ is turned on. It will be apparent that the one of the antifuses F1 and F2 (F2') corresponding to the selected one of the transistors $Q_{S1}$ and $Q_{S2}$ is determined by sensing latch 2 as having the higher resistance value, since the voltage drop across the non-selected antifuse will be essentially zero. Thus, in the State Soft Set operating mode, sensing latch 2 advantageously can be set to either operating state.

Figure 3:
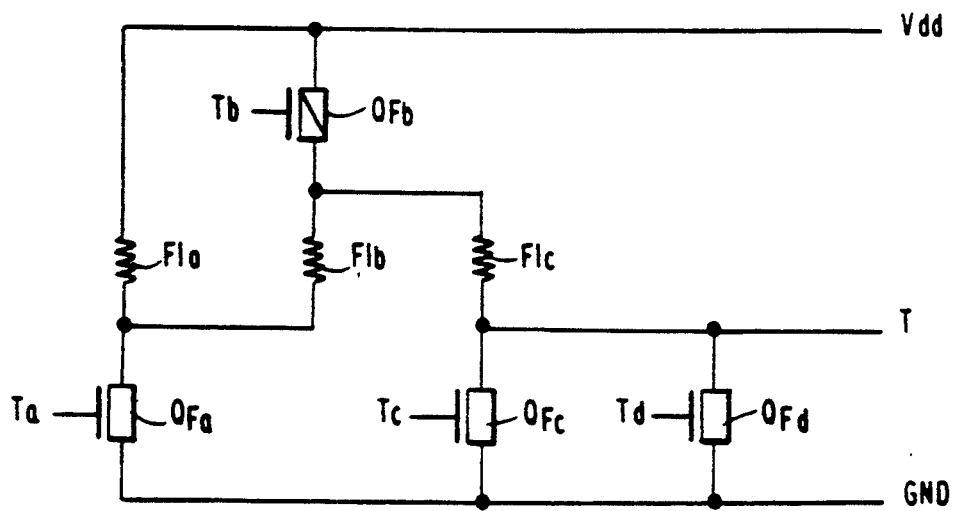
FIG. 3 is a schematic diagram of a programmable antifuse circuit shown in FIGS. 1A and 1B.

The programmable antifuse circuit F1 according to the present invention is shown in FIG. 3 and comprises three resistors F1a, F1b and F1c coupled to a supply voltage source ($V_{dd}$), and output terminal T and ground GND by a plurality of switching transistors $Q_{Fa}$ through $Q_{Fd}$. Each of the transistors $Q_{Fa}-Q_{Fd}$ receives a plurality of control signals at a control terminal Ta—Td, respectively. Preferably, each of the resistors F1a through F1c is formed from an unsilicided polysilicon conductor strip and have equal resistances. For example, when the total series resistance of the programmable antifuse circuit F1 is 2000 ohms, each of the resistors has an individual resistance of about 670 ohms. Preferably, the dopant of the unsilicided polysilicon conductor is phosphorous, boron or arsenic.

When sensing the programming state of the circuit F1, transistors $Q_{Fa}$, $Q_{Fb}$ and $Q_{Fc}$ are off while transistor $Q_{Fd}$ is on. It will be appreciated that in this first condition, resistors F1a, F1b and F1c are connected in series between $V_{dd}$ and terminal T. $Q_{Fd}$ advantageously is turned on to limit current through resistors F1a - F1c to a value less than the threshold current, which is discussed in greater detail below. It will be apparent that, when resistors F1a - F1c provide sufficient series resistance to significantly limit the current through the series connected resistors, the transistor $Q_{Fd}$ can be omitted, allowing transistor $Q_{Fc}$ to control current during both sensing and programming. During programming of antifuse F1, control signals are applied to turn on transistors $Q_{Fa}-Q_{Fc}$, thus coupling resistors F1a —F1c in parallel and producing a current greater than the threshold current in each of the resistors F1a —F1c.

As disclosed in the Kato et al. reference, discussed above, the resistance of a polysilicon conductor having Na, Nd dopant concentrations greater than $10^{20}/cm^3$, when subjected to a current density J of at least $1.0 \times 10^6$ A/$cm^2$ over a period of about 0.5 $\mu$sec, will exhibit a resistance decrease up to about 50 percent due to dopant redistribution. The resistance change is non-volatile and non-destructive unless the conductor is again subjected to a current density greater than J for a period of time longer than 0.5 $\mu$sec. Assuming the polysilicon conductor has cross section dimensions of $0.3 \times 10^{-4}$ cm and $0.35 \times 10^{-4}$ cm, in an exemplary case, a threshold current $I_{TH}$ of about 1.05 mA would provide the required value of J. In another exemplary case, where the series resistance of F1 is 2000 ohms and fuse element cross section is 350 nanometers by 600 nanometers, the threshold current $I_{TH}$ would be at least 5.0 mA, thus requiring an applied voltage of at least 10 V. It will be appreciated that the required voltage is too high to be applied to the entire chip.

Figure 4:
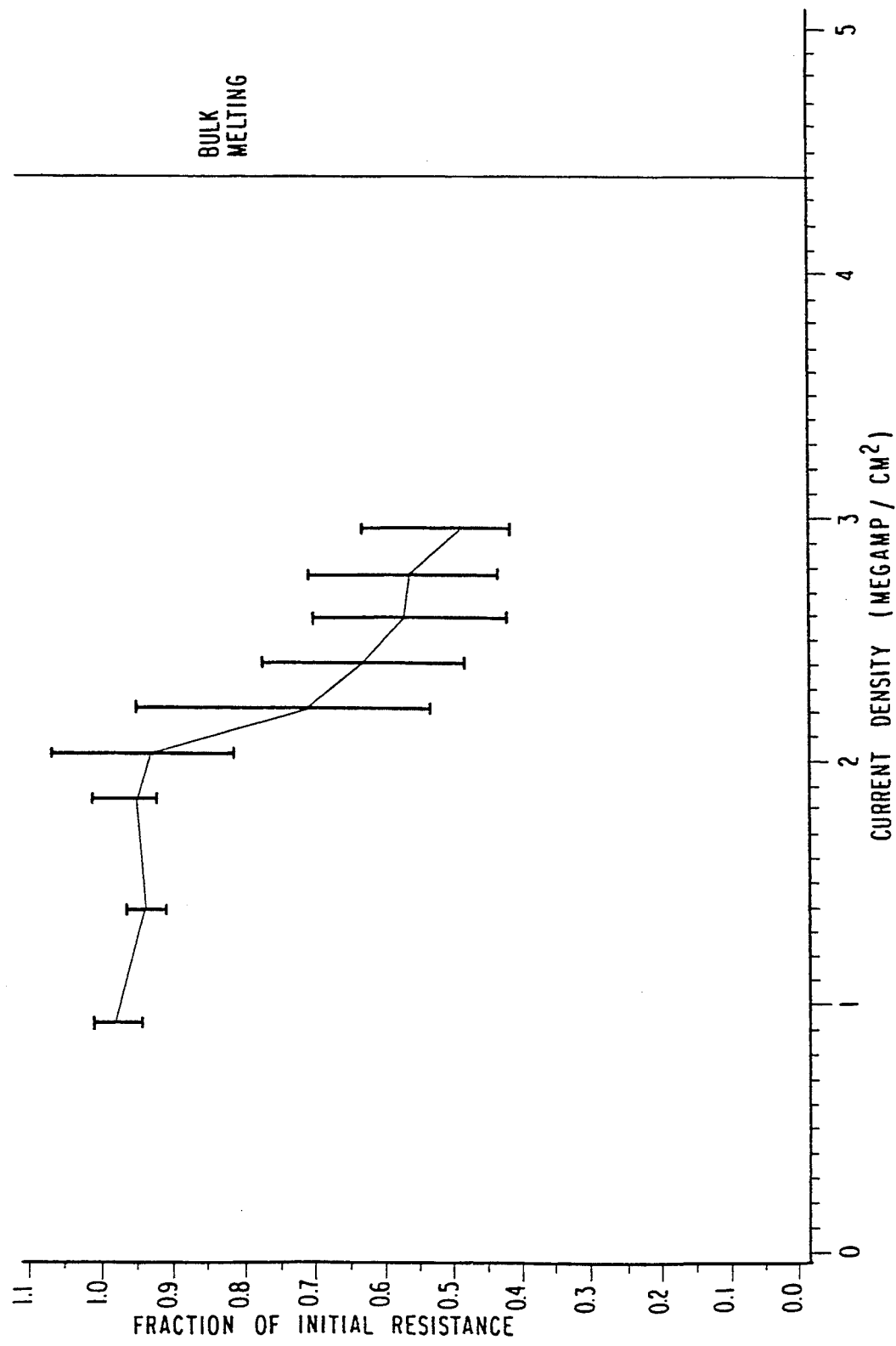
FIG. 4 is a graph illustrating changes in resistance of the resistors of the programmable antifuse circuit shown in FIG. 3 due to a plurality of applied modifying currents.
Figure 5:
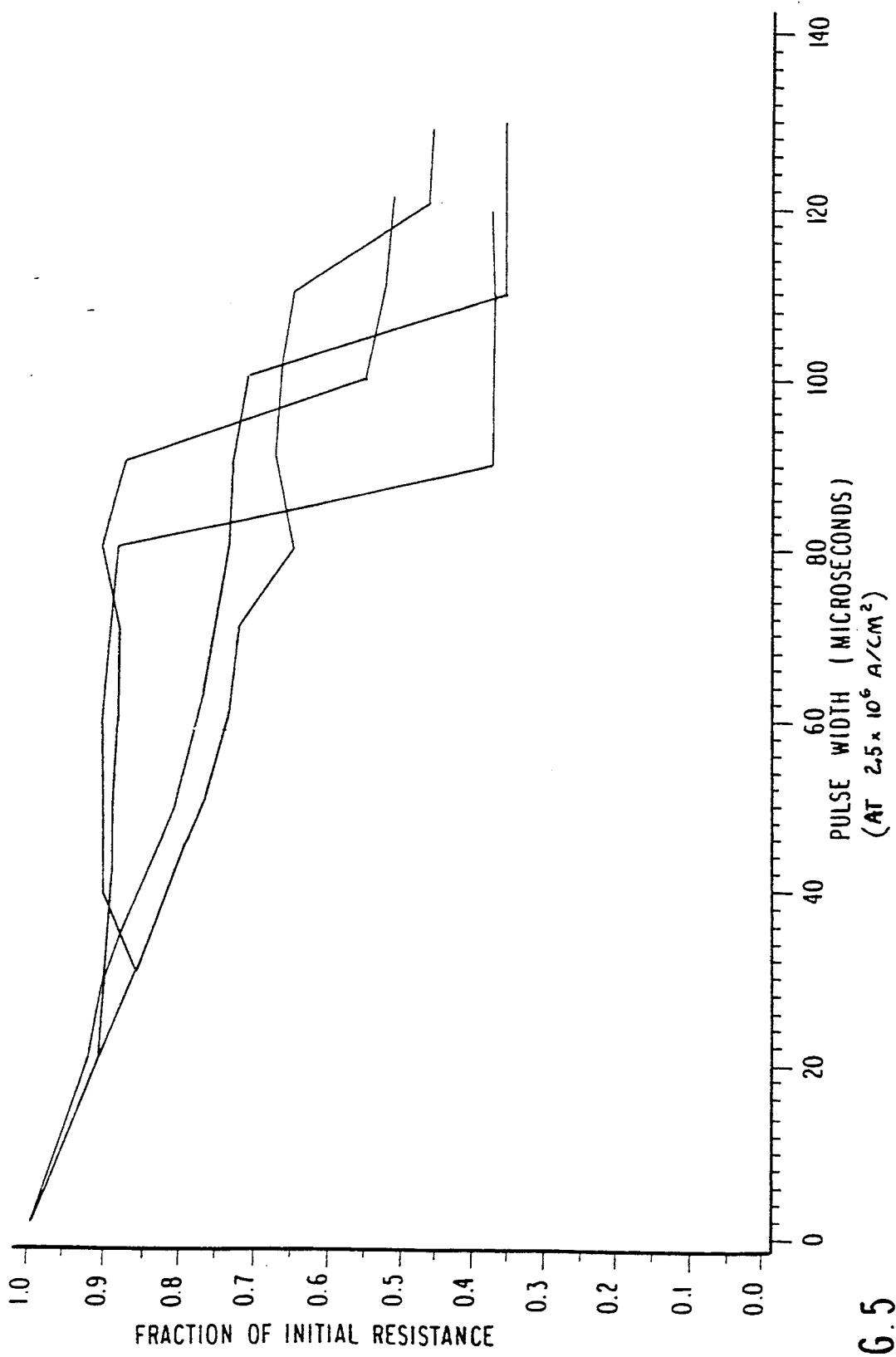
FIG. 5 is a graph illustrating changes in resistance of the resistors of the programmable antifuse circuit shown in FIG. 3 due to a plurality of applied modifying currents having varying pulse widths.

Referring to FIGS. 4 and 5, actual experiments with unsilicided polysilicon conductors indicate that current densities on the order of about $2.5 \times 10^6$ amps are required to modify unsilicided polysilicon conductors used in the antifuses to produce a resistance change of about 20 percent. FIG. 4, for example, shows current density versus the fraction of initial resistance produced by the applied modifying current. FIG. 5 shows the pulse width of the applied modifying current versus change in resistance.

Referring to FIG. 3, it will be noted that resistors F1a - F1c, when coupled in parallel by transistors $Q_{Fa}$ - $Q_{Fc}$ permit the required current density to be achieved with a significantly lower applied voltage. In the example where 10 V is applied to produce the required threshold current $I_{TH}$, an equivalent current density advantageously can be achieved in parallel resistors F1a - F1c with an applied voltage of about 4 V, instead of the previously required 10 V.

Figure 6:
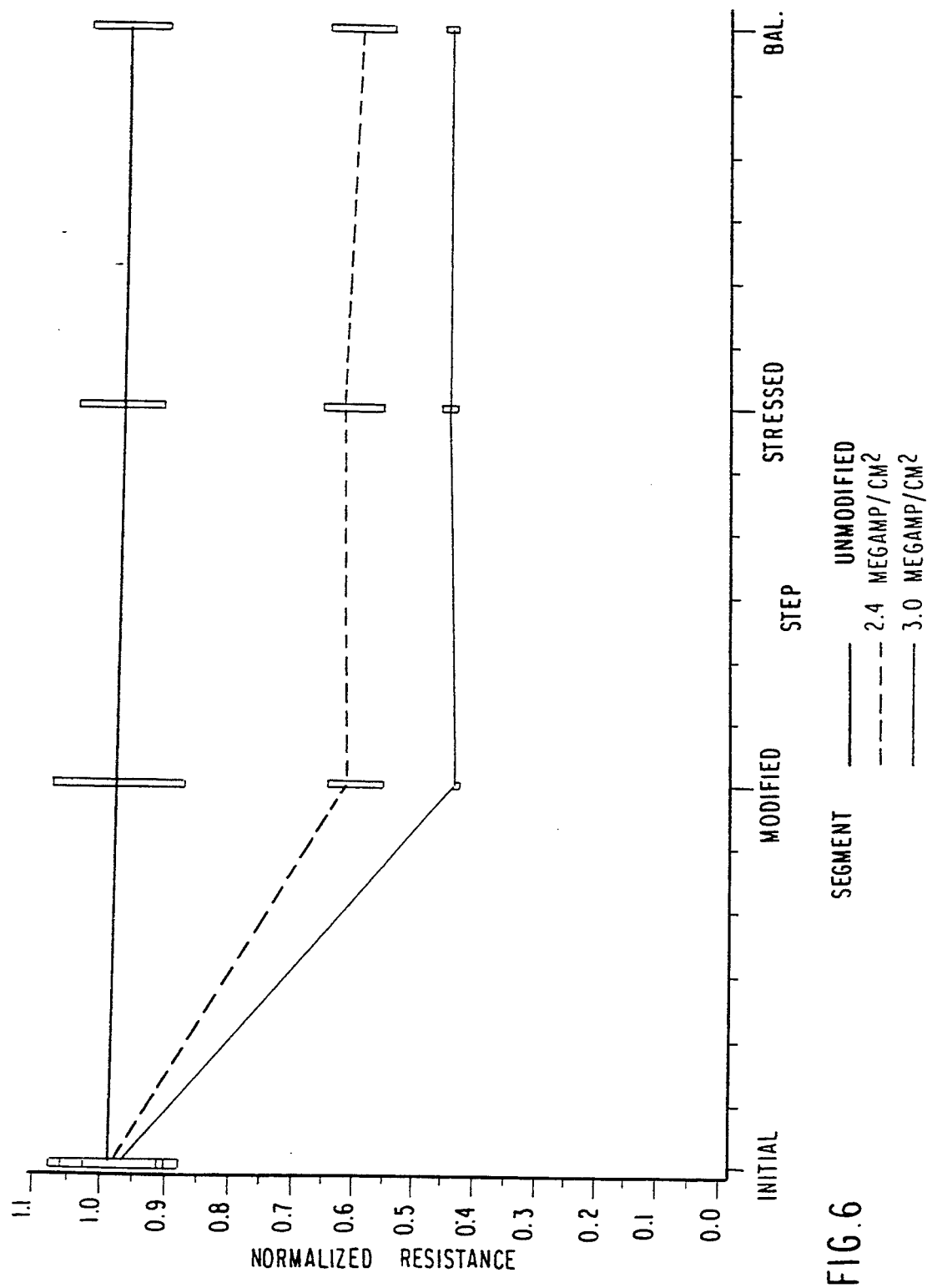
FIG. 6 is a graph illustrating the stability of the antifuse elements of the programmable antifuse circuit shown in FIG. 3.

It should be noted that the predetermined initialization current of programmable storage element 1 advantageously is significantly lower than the threshold current, i.e., about 1/10 the threshold current. It should also be noted that the initialization current is applied for a much shorter period of time than the threshold current, i.e., about 1/100 of the threshold current application time. Therefore, the resistance value of F1 will be stable irrespective of the number of initializations of the programmable storage element 1 since the initialization current and the initialization period are always at least one order of magnitude less than those needed to change the resistance of F1. This result is clearly shown in FIG. 6, which illustrates stressing of programmable storage element 1 using initialization currents having a magnitude of about 50% of the threshold current $I_{TH}$. FIG. 6 also shows the stability of programmable storage element 1 to baking at temperatures of about 200° C.

Figure 7:
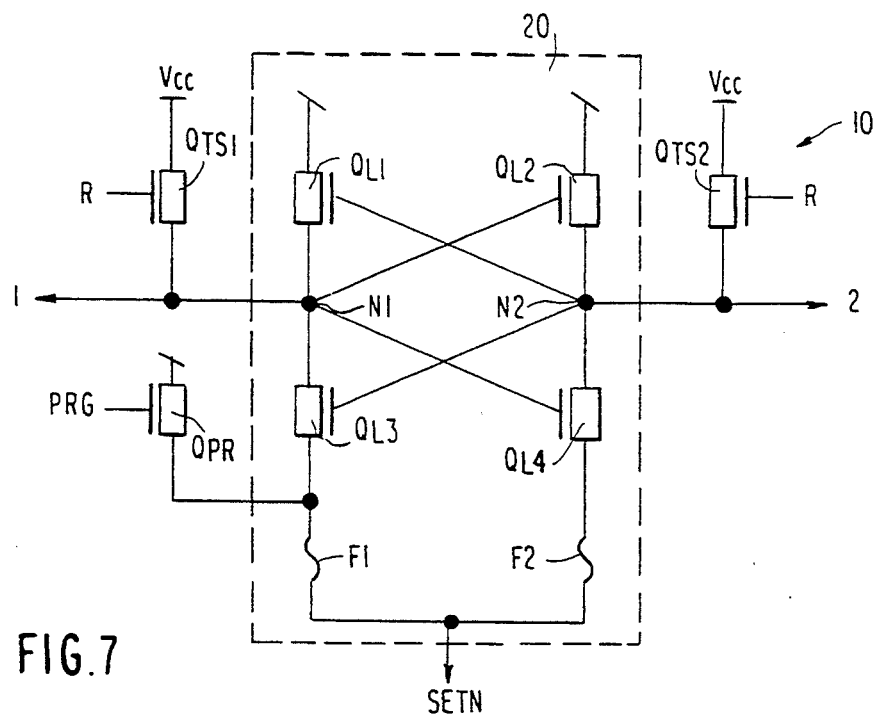
FIG. 7 is a schematic diagram of another preferred embodiment of programmable storage element according to the present invention.

FIG. 7 illustrates another preferred embodiment of the programmable storage element 10 according to the present invention comprising a programmable antifuse circuit F1, a second antifuse F2, a transistor $Q_{PR}$ for programming antifuse F1, a plurality of transistors $Q_{L1}$ through $Q_{L4}$ providing a sensing latch 20 with nodes N1 and N2 and a pair of transistors $Q_{TS1}$ and $Q_{TS2}$. Preferably, the resistance of antifuse F2 is about 0.9 times the initial resistance of antifuse F1.

Figure 8:
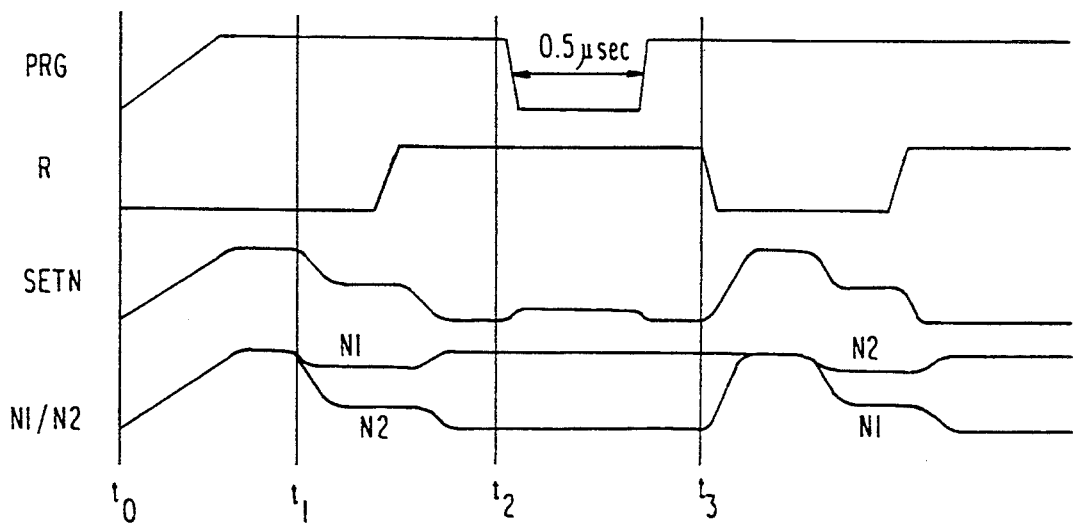
FIG. 8 is a graphical illustration of a plurality of wave forms produced by the programmable storage element of FIG. 7 during several operational modes.

The various operational modes of programmable storage element 10 will be described while referring to FIG. 8. During the Chip Power Up mode, shown starting at time $t_0$, signals PRG and SETN ramp up with applied voltage $V_{CC}$ while signal R remains active low, allowing nodes N1 and N2 to ramp up with $V_{CC}$. At time $t_1$, Redundancy Initialization mode begins with SETN being pulled towards ground GND through a conventional slow set device (not shown) while R remains active low. Because of the resistance difference between antifuses F1 and F2 and the resultant feedback, node N1 attempts to stay high while node N2 discharges towards SETN. R then goes high, turning transistors $Q_{TS1}$ and $Q_{TS2}$ off. R going high also enables a conventional fast set device, which completes latch initialization with node N1 at $V_{CC}$ and node N2 at GND.

During the Redundancy Invoke operational mode, shown starting at time $t_2$, SETN and N2 remain low, while N1 and R remain high. Input signal PRG to transistor $Q_{P1}$ goes active low, corresponding to the redundant address, allowing a predetermined threshold current to pass through antifuse F1 for a period of time of about 0.5 microseconds ($\mu$sec), which causes the resistance of F1 to decrease by an amount in the range of 20 to 50%.

Upon completion of antifuse F1 programming, shown at time $t_3$, the fuse detect latch formed from transistors $Q_{L1}-Q_{L4}$ is reset by R going active low while SETN is restored to the high value. The latch is then reinitialized in a manner substantially similar to Redundancy Initialization, discussed above, but, because the resistance of F1 was decreased during programming, the latch is set in the opposite state with N1 low and N2 high.

It will be noted, when comparing the programmable storage element 1, 1' of FIGS. 1A and 1B with the programmable storage element 10 of FIG. 7, that antifuses F1 and F2 are isolated from currents in sensing latch 2 while antifuses F1 and F2 are subjected to currents in sensing latch 20. It will be apparent from the embodiments shown in FIGS. 1A and 1B that higher resistance antifuses F1 and F2 can be used since the antifuses F1 and F2 do not conduct the current needed to set sensing latch 2. It will be further noted that the peak current passing through antifuses F1 and F2 of FIGS. 1A and 1B advantageously can be limited to a low value.

Those of ordinary skill in the art will appreciate that the programmable antifuse circuit F1 according to the present invention permits programming redundancy after burn-in or in the field at a voltage which is less than burn-in voltage. It will be noted that this programming redundancy is achieved without the need for dedicated pins in the semiconductor device.

It will also be apparent that the programmable storage element of the present invention advantageously can provide redundancy-programming at higher speeds and significantly lower capital costs than currently used laser programming. For example, semiconductor devices employing the programmable storage element can be programmed using a conventional programmable computer driven bench tester instead of the more costly laser redundancy-programming equipment. Faster programming speeds are achieved by the present invention because the mechanical stage movement, which has a fuse selection rate of about 1 fuse per millisecond and which is required for laser redundancy-programming, is eliminated.

It should also be noted that a semiconductor device including the programmable storage element of the present invention is inherently more stable than a similar device which is laser programmed. Programming according to the present invention advantageously does not produce the blast crater associated with laser programming and, thus, does not require subsequent removal of resolidified molten Si debris from the laser fuse site. In addition, there are no additional processing steps needed to open a fuse "bay window." In general, the fuse elements of the invention can be laid out in a far denser pattern than the laser fuses of the prior art.

Other modifications and variations to the invention will be apparent to those skilled in the art from the foregoing disclosure and teachings. Thus, while only certain embodiments of the invention have been specifically described herein, it will be apparent that numerous modifications may be made thereto without departing from the spirit and scope of the invention.

What is claimed is:

1. A programmable storage device, comprising:
   a plurality of resistors, said resistors including at least one electrically tunable resistor, said resistors having a series predetermined first resistance, said predetermined first resistance being reducible to a predetermined second resistance in response to an applied predetermined threshold current; and
   switching means for coupling said resistors in series in response to a plurality of first control signals and for coupling said resistors in parallel in response to a plurality of second control signals for permitting application of said predetermined threshold current to said at least one electrically tunable resistor.

2. The programmable storage device of claim 1, wherein each of said resistors is a polysilicon conductor.

3. The programmable storage device of claim 1, wherein said plurality of resistors is at least three resistors, and wherein said at least one electrically tunable resistor is an unsilicided polysilicon conductor.

4. The programmable storage device of claim 1, wherein said predetermined second resistance is no more than approximately 80 percent of said predetermined first resistance.

5. The programmable storage device of claim 1, wherein said predetermined second resistance is no more than approximately 50 percent of said predetermined first resistance.

6. A programmable storage device, comprising:
   a plurality of first resistors including at least one electrically tunable first resistor;
   switching means for operatively coupling said first resistors in series in response to a plurality of first control signals and for operatively coupling said first resistors in parallel in response to a plurality of second control signals for permitting programming of said first resistors; and
   means for determining whether or not said first resistors have been programmed.

7. The programmable storage device of claim 6, further comprising:
   a plurality of second resistors including at least one electrically tunable second resistor; and
   second switching means for coupling said second resistors in series in response to a plurality of third control signals and for coupling said second resistors in parallel in response to a plurality of fourth control signals so as to permit programming of said second resistors; wherein said means for determining comprises means for determining whether or not one of said first and said second resistors have been programmed.

8. The programmable storage device of claim 6, further comprising an element, wherein said means for determining comprises means for comparing a first voltage drop across said first resistors with a second voltage drop across said element.

9. The programmable storage device of claim 6, wherein each of said first resistors is a polysilicon conductor.

10. The programmable storage device of claim 6, wherein said switching means comprises a plurality of transistors.

11. A semiconductor device having a programmable storage element for programming redundancy, said semiconductor device comprising:
    a plurality of first resistors including at least one electrically tunable first resistor;
    a plurality of second resistors including at least one electrically tunable second resistor;
    a plurality of first transistors for operatively coupling said first resistors in series in response to a plurality of first control signals and for operatively coupling said resistors in parallel in response to a plurality of second control signals for permitting programming of said at least one electrically tunable first resistor using a programming current having a magnitude greater than or equal to a predetermined threshold current and having a pulse width greater than a predetermined time period; and
    a plurality of second transistors for operatively coupling said second resistors in series in response to a plurality of third control signals and for operatively coupling said second resistors in parallel in response to a plurality of fourth control signals for permitting programming of said at least one electrically tunable second resistor using a second programming current; and a plurality of third transistors operatively coupled to produce a latch for comparing a first voltage drop across said first resistors with a second voltage drop across said second resistors to determine whether or not one of said at least one electrically tunable first resistor and said at least one electrically tunable second resistor has been programmed.

12. The programmable storage element of claim 11, wherein each of said first resistors and said second resistors is an unsilicided polysilicon conductor.

13. A memory element, comprising:

a programmable polysilicon means;

means for setting a reference resistance;

comparing means disposed between said programmable polysilicon means and said setting means for sensing differences in resistance therebetween;

means for programming said programmable polysilicon means by passing a current therethrough sufficient to decrease its resistance by a discrete amount; and output means coupled to said comparing means for producing a first signal if said programmable polysilicon means has a greater resistance than said setting means, and for producing a second signal if said setting means has a greater resistance than said programmable polysilicon means.

14. The memory element of claim 13, wherein said programmable polysilicon means has a greater resistance than said setting means prior to programming.

15. The memory element of claim 13, wherein said programmable polysilicon means and said setting means have resistances that are substantially equal prior to programming.

16. The memory element of claim 13, wherein said comparing means comprises a cross-coupled latch.

17. The memory element of claim 13, wherein said comparing means is coupled to said programmable polysilicon means and said setting means by first and second pass transistors, respectively.

18. The memory element of claim 17, wherein said first pass transistor isolates said programmable polysilicon means from said comparing means during programming.

19. The memory element of claim 15, wherein said setting means comprises a second programmable polysilicon means.

* * * * *